(12) United States Patent
Chida

(10) Patent No.: US 6,894,880 B2
(45) Date of Patent: May 17, 2005

(54) PROTECTION CIRCUIT FOR SEMICONDUCTOR LASER DEVICE

(75) Inventor: Atsushi Chida, Kashihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 141 days.

(21) Appl. No.: 09/918,433

(22) Filed: Aug. 1, 2001

(65) Prior Publication Data

US 2002/0015274 A1 Feb. 7, 2002

(30) Foreign Application Priority Data

Aug. 1, 2000 (JP) ........................................ 2000-233295

(51) Int. Cl.[7] .............................................. H02H 9/00
(52) U.S. Cl. ........................................ 361/56; 361/111
(58) Field of Search .......................... 361/56, 57, 58, 361/111, 93.9, 120, 129, 130, 118; 372/43–45, 109

(56) References Cited

U.S. PATENT DOCUMENTS

| | | | | |
|---|---|---|---|---|
| 3,938,172 A | * | 2/1976 | Lockwood | 372/45 |
| 4,974,229 A | * | 11/1990 | Egawa | 372/38.04 |
| 5,065,226 A | * | 11/1991 | Kluitmans et al. | 257/433 |
| 5,548,291 A | * | 8/1996 | Meier et al. | 340/10.34 |
| 6,292,500 B1 | * | 9/2001 | Kouchi et al. | 372/38.1 |
| 6,346,564 B1 | * | 2/2002 | Kubota et al. | 524/403 |

FOREIGN PATENT DOCUMENTS

| | | |
|---|---|---|
| JP | 60-38894 A | 2/1985 |
| JP | 61-107783 A | 5/1986 |
| JP | 3-283482 A | 12/1991 |

OTHER PUBLICATIONS

Semiconductor Data Book, p. 18, 1998 (partial translation provided).

* cited by examiner

*Primary Examiner*—Ronald Leja
*Assistant Examiner*—Danny Nguyen
(74) *Attorney, Agent, or Firm*—Birch, Stewart, Kolasch & Birch, LLP

(57) ABSTRACT

A resistor is connected in series with a semiconductor laser device, while, on both sides of this resistor, a first capacitor and a second capacitor are connected in parallel with the semiconductor laser device so as to be arranged in π-type configuration, thereby achieving a high electrostatic breakdown voltage.

21 Claims, 4 Drawing Sheets

$C_1 = 1 \mu F$
$C_2 = 0.1 \mu F$
$R = 5.6 \Omega$

AVAILABLE AS COUNTERMEASURES AGAINST STATIC ELECTRICITY

AVAILABLE AS COUNTERMEASURES AGAINST STATIC ELECTRICITY

TEST CONDITIONS: AT INTERVALS OF ONE SECOND;
APPLIED FIVE TIMES

C = 1 μF
L = 45 μH

C = 1 μF
L = 45 μH

PROTECTION CIRCUIT FOR SEMICONDUCTOR LASER DEVICE

BACKGROUND OF THE INVENTION

The present invention relates to a protection circuit for protecting a semiconductor laser device from a surge, which device is to be used in an optical pickup for recording and reproducing information on and from an optical disk.

Recently, recording and reproducing devices of personal computers, and music CD players have been used in large quantities, and ever-increasing demand for optical pickups using semiconductor laser devices is presented. Under such circumstances, it has become essential to take countermeasures against static electricity of semiconductor laser devices in the production process and practical use of optical pickups and optical disc devices.

Laser diode chips (hereinafter referred to as "LD chips") that are built in semiconductor laser devices are subject to breakdowns due to surges caused by static electricity because sizes of electrodes are as small as 200–300 square micrometers.

As a protection circuit that protects an LD chip from a surge, a circuit as shown in FIG. 8 is known, in which a capacitor C and a coil L are combined (for example, see "SEMICONDUCTOR DATA BOOK", 1998, page 18, Sharp). In the protection circuit shown in FIG. 8, a capacitor C having a capacitance of 0.3–1.5 $\mu$F and a coil L having an inductance of 10–100 $\mu$H are usually used.

Further, as another circuit constitution, a protection circuit as shown in FIG. 9 is also proposed in which a coil L is inserted in series with an LD chip 11 on its anode side, and a capacitor C is connected in parallel with the LD chip 11 (JP-A-60-38894).

When using the protection circuit shown in FIG. 8 or 9, a dielectric strength of about 2 kV in terms of electrostatic breakdown voltage can be obtained.

The electrostatic breakdown voltage herein means a physical property measured using an electrostatic test circuit (in conformity with EIAJ-4701A) shown in FIG. 6. A method of testing an electrostatic breakdown voltage using the electrostatic test circuit will be described with reference to FIG. 7.

First, a PH (optical output power)—Iop (I-L) characteristic of an LD chip is measured (an I-L curve with a legend "BEFORE TEST" in FIG. 7). Next, with the voltage of an internal power supply 31 of the electrostatic circuit shown in FIG. 6 set for "V" (kV), a switch 32 is connected to an X terminal so that a capacitor 34 having a capacitance of 200 pF is charged through a charging resistor 33. After completion of the charging, the switch 32 is connected to a Y terminal so that an electrical current flows through the LD chip via a circuit board 12 on which a semiconductor laser device including the LD chip is mounted. The internal resistance of the electrostatic test circuit is set for 0 $\Omega$.

The above process is repeated five times at intervals of one second and then the I-L characteristic of the LD chip is measured again. If a current value (Iop) passing the LD chip at a prescribed optical output power increases by 20% or less after the test, compared with that before the test, the electrostatic breakdown voltage is judged to be "V" or higher (for example, the I-L curve with a legend "NON-DEFECTIVE AFTER TEST" in FIG. 7).

The similar experiment is further repeated while increasing the voltage of the internal power supply 31. When an Iop value at a prescribed optical output power increases by at least 20% compared with that before the test, the voltage immediately before the increase is judged to be an electrostatic breakdown voltage. When a voltage of more than the electrostatic breakdown voltage is applied through the circuit board 12, the semiconductor laser device deteriorates, resulting in an optical output power (PH) of at most 5 mW in many cases (for example, the I-L curve with a legend "DETERIORATION" in FIG. 7).

Incidentally, when using the conventional protection circuit shown in FIG. 8 or 9, the electrostatic breakdown voltage is about 2 kV as described above. From this, it is concluded that the protection circuit achieves a considerable effect compared with the case where there is no protection circuit (in which case the electrostatic breakdown voltage is less than 100 V).

However, with the recent mass production of optical pickups, countermeasures against static electricity in the production process have been simplified. As a result, a higher electrostatic breakdown voltage (for example, more than 2 kV) has been required.

SUMMARY OF THE INVENTION

The present invention was made in view of such circumstances. An object of the present invention is to provide a protection circuit for a semiconductor laser device capable of achieving an electrostatic breakdown voltage higher than that achieved by the conventional device.

A protection circuit for a semiconductor laser device according to the present invention has a resistor or coil connected in series with the semiconductor laser device, and a first capacitor and a second capacitor that are connected in parallel with the semiconductor laser device on opposite sides of the resistor or coil. In other words, the capacitors and the resistor or coil are arranged in $\pi$-type configuration. By arranging them in this way, a high electrostatic breakdown voltage can be obtained.

In the protection circuit of the present invention, a low frequency capacitor may be used for one of the first and second capacitors, and a high frequency capacitor may be used for the other of the first and second capacitors. By doing so, a high electrostatic breakdown voltage is secured.

In the protection circuit of the present invention, the first capacitor and/or the second capacitor may be a capacitor in which a low frequency capacitor and a high frequency capacitor are connected in parallel. In that case, the electrostatic breakdown voltage is further increased.

Furthermore, in the protection circuit of the present invention, multilayered ceramic-type chip capacitors may be used for both of the first and second capacitors. Use of the multilayered ceramic-type chip capacitors allows a low frequency capacitor and a high frequency capacitor to be obtained only by changing the capacitance, and without changing the other characteristics. Further, by using not only the chip capacitors but also a chip resistor or chip coil for the above-mentioned chip or coil, miniaturization of the protection circuit is achievable. Furthermore, use of the chip capacitors and the chip resistor or chip coil also makes it possible to realize automated (mechanized) chip mounting operation, which leads to higher productivity.

In the protection circuit of the present invention, the first and second capacitors and the resistor (or coil) may be mounted on the same circuit board that the semiconductor laser device is mounted on. By thus doing, the number of elements can be reduced, leading to space saving and cost reduction. Furthermore, in this case, if the second capacitor and the resistor or coil are disposed in the vicinity of the semiconductor laser device, while the first capacitor is disposed in the vicinity of an input terminal of the circuit board, an electrostatic breakdown voltage can be increased more.

Further, in the case of mounting the capacitors and the resistor (or coil) on the same circuit board that the semiconductor laser device is mounted on, with the circuit board having a plurality of wiring lines including a wiring line to supply the semiconductor laser device with an electrical current, the protection circuit may further have a metallic pattern for grounding that is formed outside of the plurality of wiring lines and at least along the wiring line to supply the semiconductor laser device with an electrical current. In this case, static electricity that enters the wiring lines of the semiconductor laser device can be dispersed efficiently. Therefore, an electrostatic breakdown voltage can be increased furthermore.

Other objects, features and advantages of the present invention will be obvious from the following description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Embodiments of the present invention will be explained with reference to the accompanying drawings.

Figure 1:
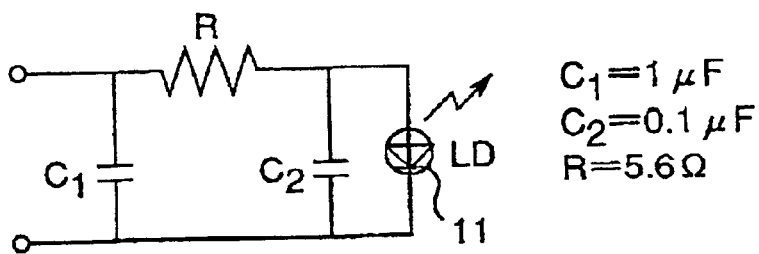
FIG. 1 is a circuit diagram of an embodiment of the protection circuit according to the present invention.

FIG. 1 is a circuit diagram showing the circuit configuration of an embodiment of the protection circuit according to the present invention.

In the protection circuit shown in FIG. 1, a resistor R is connected in series with an LD chip 11 on its anode side. On both sides of the resistor R, a first capacitor C1 and a second capacitor C2 are individually connected in parallel with the LD chip 11. Of these two capacitors C1 and C2, the second capacitor C2 is disposed on a side closer to the LD chip 11, while the first capacitor C1 is disposed on a side farther from the LD chip 11, with the resistor R disposed therebetween.

In the present embodiment, a multilayered ceramic chip capacitor having a capacitance of 1 $\mu$F is used as the first capacitor C1, while a multilayered ceramic chip capacitor having a capacitance of 0.1 $\mu$F is used as the second capacitor C2.

Although both of the two capacitors are multilayered ceramic chip capacitors, the capacitance of the first capacitor C1 is different from that of the second capacitor C2 by one digit. Thus, there is a big difference in the size of the electrode area of the chip between the first capacitor C1 (whose electrode area is three square millimeters) and the second capacitor C2 (whose electrode area is one square millimeter), and an impedance characteristic of the first capacitor C1 is different from that of the second capacitor C2. That is, since the capacitance of the chip capacitor depends on the size of the electrode area, the larger the capacitance, the larger the electrode area of the capacitor, and the impedance is low in a low-frequency region. Contrary to this, in the capacitor having a small capacitance, the impedance is low in a high-frequency region.

The reason why the two capacitors C1 and C2 are used in the present embodiment will be explained below.

First, various studies have revealed that it is important to expand a frequency region where the impedance of the protection circuit is low, in order to improve the electrostatic breakdown voltage of the semiconductor laser device. Further, combinations/arrangement of capacitors and a resistor (or a coil) and so on were studied to expand the frequency region where the impedance of the protection circuit is low. As a result, it was found that an optimum combination/arrangement was that a low frequency capacitor having a low impedance in a low frequency region and a high frequency capacitor having a low impedance in a high frequency region are used in combination and arranged in parallel with a semiconductor laser device.

Figure 2A:
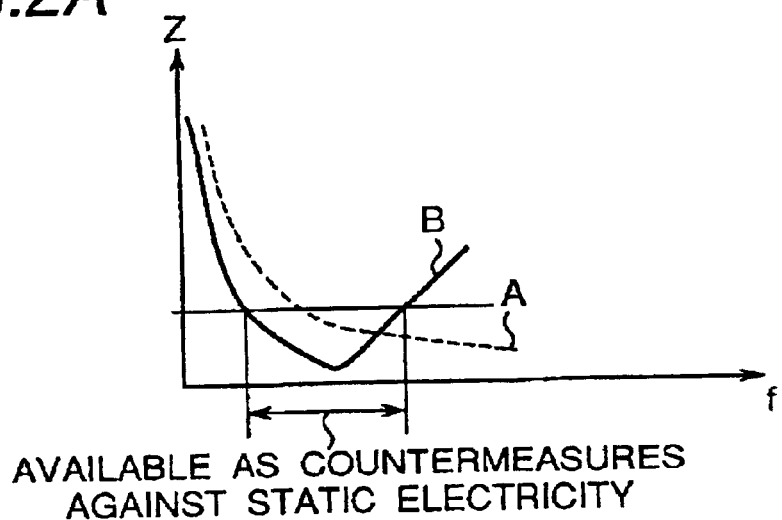
FIGS. 2A and 2B are diagrams schematically showing characteristics of capacitors.

Describing this specifically, as shown with a curve A of broken line in FIG. 2A representing an ideal capacitor characteristic, an ideal capacitor having a capacitance of C has the following impedance Z: $Z=1/\omega C=1/2\ \pi f C$ where $\omega$ is an angular frequency, and it is known that the angular frequency $\omega$ and the frequency f has a relationship of $\omega=2\pi f$. However, since an actual capacitor involves a coil component, the impedance Z is raised in the high frequency region as shown with a curve B of solid line in FIG. 2A. Accordingly, when using one capacitor, a frequency region available as countermeasures against static electricity (the frequency region where the impedance is low) is limited.

Figure 2B:
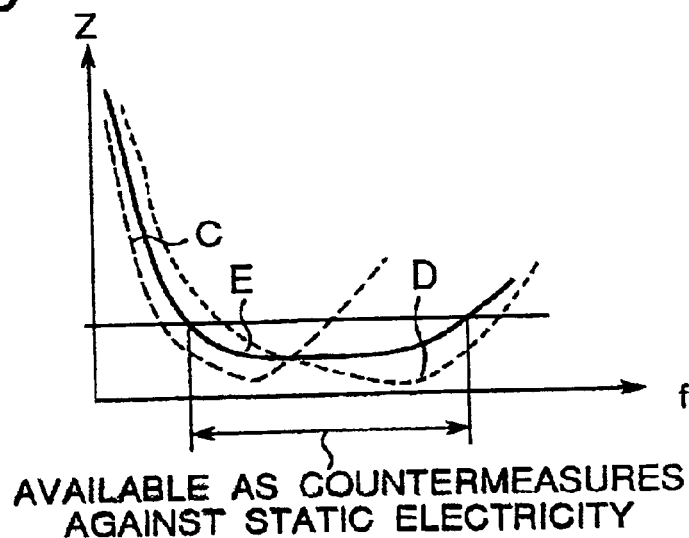

Contrary to this, when a low frequency capacitor having a low impedance in a low frequency region and a high frequency capacitor having a low impedance in a high frequency region are connected in parallel with a semiconductor laser device, a characteristic represented by a curve E of solid line in FIG. 2B is obtained. That is, the frequency region where the impedance is low is expanded compared with the case where only one capacitor is used (FIG. 2A). In FIG. 2B, a curve C represents a characteristic of the low-frequency capacitor and a curve D represents a characteristic of the high-frequency capacitor.

In the present embodiment, a chip resistor having a resistance of 5.6 $\Omega$ is used as the resistor R. The resistor R preferably has a resistance that is as high as possible, however, if it is too high, a voltage drop is caused by the resistor, raising a problem in practical use. On the other hand, the driving current of the semiconductor laser device is usually in the range between 50 mA and 100 mA approximately. Therefore, if the voltage drop due to the resistor R is not more than 0.6 V, there is no problem in this level. Taking these things into consideration, the resistance is set for 5.6 $\Omega$ in the present embodiment.

Figure 8:
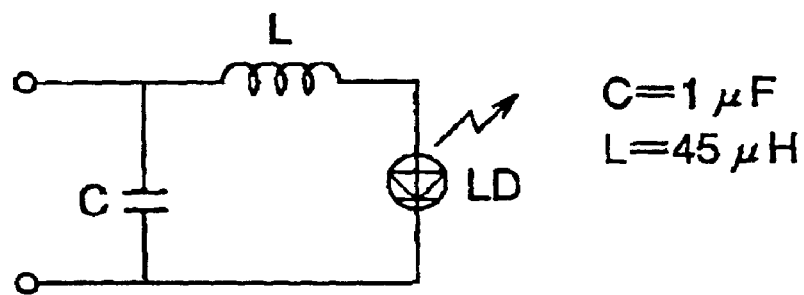
FIG. 8 is a diagram showing one example of a conventional protection circuit.
Figure 9:
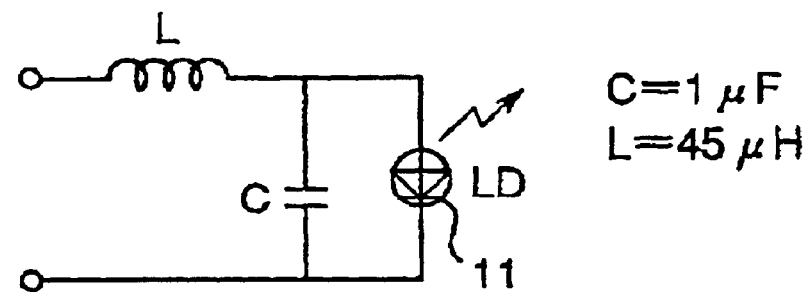
FIG. 9 is a diagram showing another example of a conventional protection circuit.

In the protection circuit, the first capacitor C1, the second capacitor C2 and the resistor R are arranged in $\pi$-type configuration as shown in FIG. 1, with the capacitance of the first capacitor C1, that of the second capacitor C2 and the resistance of the resistor R being 1 $\mu$F, 0.1 $\mu$F and 5.6 $\Omega$, respectively, whereby a high electrostatic breakdown voltage of 4 kV, which is approximately as twice as that of the conventional protection circuit (FIG. 8 or 9), was obtained.

A modification of the protection circuit will be described with reference to FIG. 3.

In this example, the arrangement or layout of the first capacitor C1, second capacitor C2 and resistor R is the same as that of the protection circuit shown in FIG. 1. Further, the resistance of the resistor R in FIG. 3 is the same as in FIG. 1. This modified protection circuit differs from the protection circuit shown in FIG. 1 only in that a low frequency capacitor having a capacitance of 1 $\mu$F (or a high frequency capacitor having a capacitance of 0.1 $\mu$F) is used for each of the capacitors C1 and C2.

Figure 3:
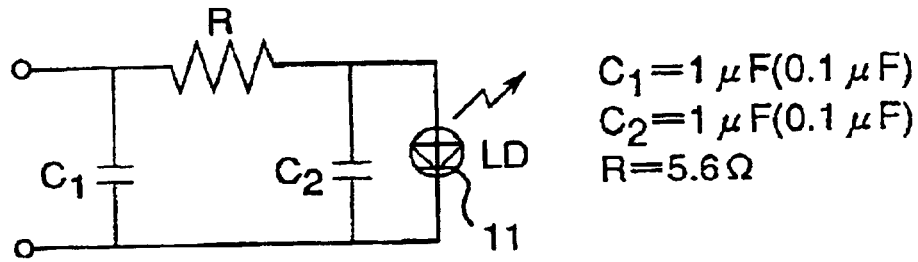
FIG. 3 is a circuit diagram of a modification of the embodiment shown in FIG. 1.

The protection circuit shown in FIG. 3 has achieved an electrostatic breakdown voltage of 3 kV, which is 1.5 times as high as that achieved by the conventional protection circuit.

Next, the arrangement or layout of the capacitors and the resistor in an actual circuit board will be described with reference to FIG. 4.

A lead pin 11a that is an LD chip terminal of a semiconductor laser device 1 is connected to a position P in the circuit board 2. In the vicinity of the position P (usually at a distance of not more than 5 mm), a resistor R and one terminal of a second capacitor C2 are connected.

The circuit board 2 has an IC for controlling an optical output of the LD chip, an IC for superimposing a high frequency signal on an electrical current that drives the LD chip, an IC for amplifying and demodulating an output of a photoreceiver incorporated in the semiconductor laser device 1 to receive light containing signals from an optical disc, and the like. Therefore, it is required to extend a wiring line 22 that supply the LD chip with an electrical current. This circuit board 2 is connected to an external power supply via input terminals 21, . . . , 21.

In the circuit board 2 like this, it is considered that a surge enters the wiring line 22, which supplies the LD chip with an electrical current, from the outside to destroy it. Although the routes through which a surge enters the wiring line 22 are not clear, it is considered that there are two broadly-categorized surges: a surge that comes from circuit elements between the external power supply and the circuit board 2, namely from the input terminals 21 of the circuit board 2, and a surge that comes from the wiring lines on the circuit board 2.

Among these surges, the surge that comes from the input terminals 21 of the circuit board 2 can be absorbed to some extent by using a low frequency capacitor as the first capacitor C1. Further, the surge that remains without being removed by the first capacitor C1 and the surge that comes from the wiring lines on the circuit board 2 can be removed efficiently by using a high frequency capacitor as the second capacitor C2.

Furthermore, a metallic pattern 23 for the ground GND is formed outside of the wiring lines and along at least the wiring line 22 for supplying the semiconductor laser device 1 with an electrical current. The first capacitor C1 and the other terminal of the second capacitor C2 are connected to the metallic pattern 23. With this structure, an electrostatic breakdown voltage is further enhanced. In this case, if a large area of the metallic pattern 23 for the ground GND is secured, static electricity that enters the wiring lines can be dispersed efficiently. Accordingly, the electrostatic breakdown voltage can be enhanced furthermore.

Another embodiment of the protection circuit according to the present invention will be described below with reference to FIG. 5.

Figure 5:
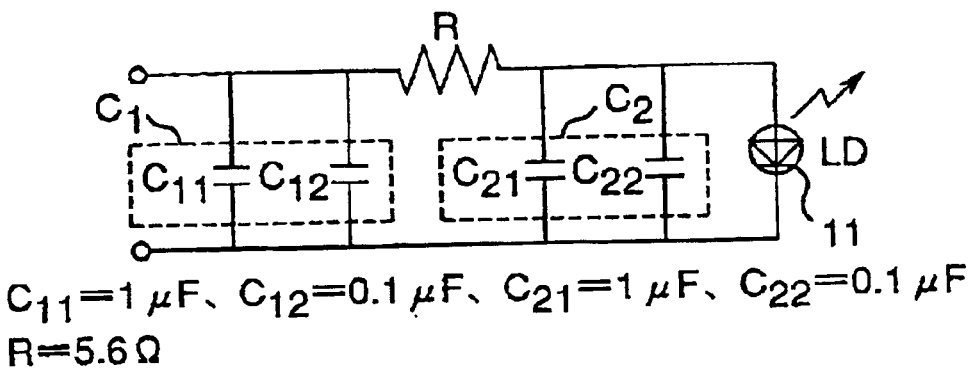
FIG. 5 is a circuit diagram of another embodiment of the protection circuit according to the present invention.
Figure 6:
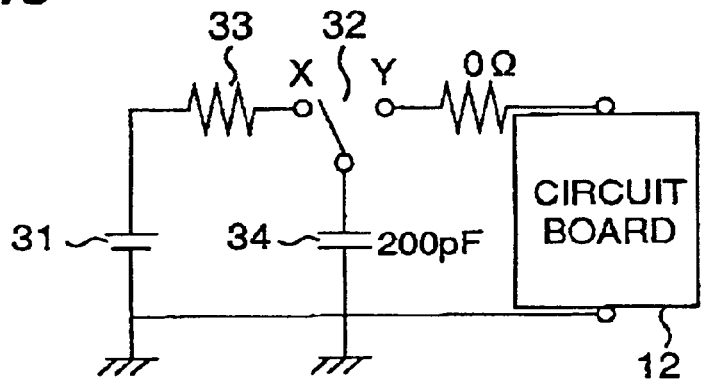
FIG. 6 is a circuit diagram showing the constitution of an electrostatic test circuit to be used for measurement of an electrostatic breakdown voltage.
Figure 7:
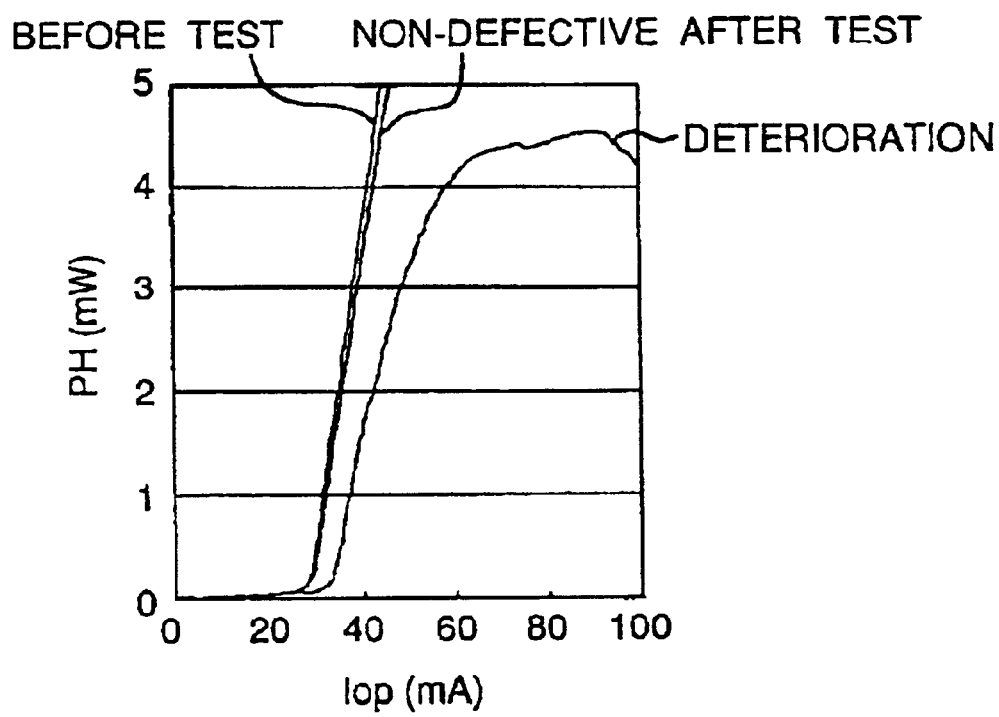
FIG. 7 is a diagram showing I-L characteristic curves.

In the protection circuit of this embodiment shown in FIG. 5, the first capacitor C1 of the protection circuit shown in FIG. 1 is replaced with a first capacitor C1 provided by a combination of a low frequency capacitor C11 having a capacitance of 1 $\mu$F and a high frequency capacitor C12 having a capacitance of 0.1 $\mu$F (both of which are multilayered ceramic chip capacitors) that are connected in parallel. Further, in the same manner as above, the second capacitor C2 of FIG. 1 is replaced with a second capacitor C2 provided by a combination of a low frequency capacitor C21 having a capacitance of 1 $\mu$F. and a high frequency capacitor C22 having a capacitance of 0.1 $\mu$F that are connected in parallel. In this embodiment as well, a chip resistor having a resistance of 5.6 $\Omega$ is used as the resistor R.

The electrostatic breakdown voltage achieved by the protection circuit shown in FIG. 5 was 6.2 kV, which is about 1.5 times as high as the electrostatic breakdown voltage achieved by the conventional protection circuit.

Figure 4:
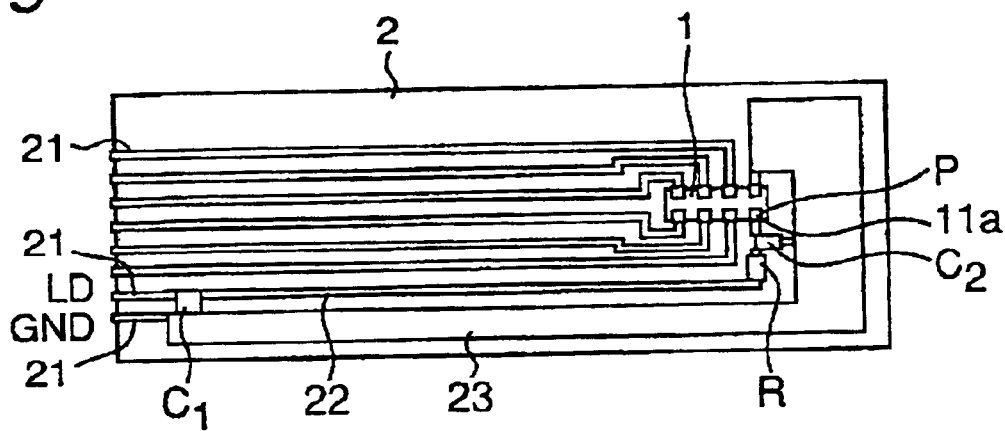
FIG. 4 shows an example of placement of a protection circuit on a circuit board.

Further, when using the protection circuit shown in FIG. 5 as well, it is preferred that the second capacitor C2 and the resistor R are disposed in the vicinity of a terminal of the semiconductor laser device, preferably within 5 mm, and that the first capacitor C1 is disposed in the vicinity of the input terminal 21 as in the example of the arrangement shown in FIG. 4. Further, it is preferred that the metallic pattern 23 for the ground GND as shown in FIG. 4 is formed on the circuit board in view of an improvement in electrostatic breakdown voltage.

In each of the embodiments described above, the resistor is incorporated in the protection circuit. It is also possible to achieve an equal effect when using a coil (e.g., chip coil) in place of the resistor. For example, by using a coil having an inductance of 45 $\mu$H in place of a resistor having a resistance of 5.6 $\Omega$, an equal electrostatic breakdown voltage can be obtained. As described above, although it is possible to achieve the desired effect by using either of the resistor or coil, it is preferable to use a resistor in view of size reduction or miniaturization because the resistor occupies a smaller area than the coil.

As described above, according to the protection circuit of the present invention, the resistor or coil is connected in series with the semiconductor laser device, while, on both sides of the resistor or coil, the first and second capacitors are individually connected in parallel with the semiconductor laser device so as to be arranged in $\pi$-type configuration. As a result, a high electrostatic breakdown voltage can be obtained with a simple construction.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A protection circuit for a semiconductor laser device, comprising:
    a resistor or coil connected in series with the semiconductor laser device; and
    a first capacitor and a second capacitor that are connected in parallel with the semiconductor laser device on opposite sides of the resistor or coil in a $\pi$-type configuration for obtaining high electrostatic breakdown voltage, wherein said first capacitor has a low impedance in a frequency region and said second capacitor has a low impedance in a frequency region different from the frequency region for the low impedance of the first capacitor, and the electrostatic breakdown voltage is increased.

2. The protection circuit for a semiconductor laser device according to claim 1, wherein one of the first and second capacitors is a low frequency capacitor, while the other of the first and second capacitors is a high frequency capacitor.

3. The protection circuit for a semiconductor laser device according to claim 2, wherein the low frequency capacitor is placed less closer to the semiconductor laser device than the high frequency capacitor.

4. The protection circuit for a semiconductor laser device according to claim 1, wherein both of the first and second capacitors are multilayered ceramic chip capacitors, and the resistor or coil is a chip resistor or chip coil.

5. The protection circuit for a semiconductor laser device according to claim 1, wherein the first and second capacitors and the resistor or coil are mounted on a circuit board on which the semiconductor laser device is mounted, the second capacitor and the resistor or coil are disposed in the vicinity of a terminal of the semiconductor laser device, and the first capacitor is disposed in the vicinity of an input terminal of the circuit board.

6. The protection circuit for a semiconductor laser device according to claim 5, wherein the circuit board has a plurality of wiring lines including a wiring line to supply the semiconductor laser device with an electrical current, and the protection circuit further comprises a metallic pattern for grounding that is formed outside of the plurality of wiring lines and at least along the wiring line to supply the semiconductor laser device with an electrical current.

7. The protection circuit for a semiconductor laser device according to claim 5, wherein the first capacitor is a low frequency capacitor, and the second capacitor is a high frequency capacitor.

8. A protection circuit for a semiconductor laser device, comprising:
a resistor or coil connected in series with the semiconductor laser device; and
a low frequency capacitor and a high frequency capacitor that are connected in parallel with the semiconductor laser device on opposite sides of the resistor or coil in a π-type configuration for obtaining high electrostatic breakdown voltage.

9. The protection circuit for a semiconductor laser device according to claim 8, wherein the low frequency capacitor is placed less closer to the semiconductor laser device than the high frequency capacitor.

10. The protection circuit for a semiconductor laser device according to claim 8, wherein both of the low frequency and high frequency capacitors are multilayered ceramic chip capacitors, and the resistor or coil is a chip resistor or chip coil.

11. The protection circuit for a semiconductor laser device according to claim 8, wherein the low frequency and high frequency capacitors and the resistor or coil are mounted on a circuit board on which the semiconductor laser device is mounted, the high frequency capacitor and the resistor or coil are disposed in the vicinity of a terminal of the semiconductor laser device, and the low frequency capacitor is disposed in the vicinity of an input terminal of the circuit board.

12. The protection circuit for a semiconductor laser device according to claim 11, wherein the circuit board has a plurality of wiring lines including a wiring line to supply the semiconductor laser device with an electrical current, and the protection circuit further comprises a metallic pattern for grounding that as formed outside of the plurality of wiring lines and at least along the wiring line to supply the semiconductor laser device with an electrical current.

13. A protection circuit for a semiconductor laser device, comprising:
a resistor or coil connected in series with the semiconductor laser device; and
a first capacitor and a second capacitor that are connected in parallel with the semiconductor laser device on opposite sides of the resistor or coil in a π-type configuration for obtaining high electrostatic breakdown voltage, the first capacitor and/or the second capacitor being a capacitor in which a low frequency capacitor and a high frequency capacitor are connected in parallel for increasing the electrostatic breakdown voltage.

14. The protection circuit for a semiconductor laser device according to claim 13, wherein both of the first and second capacitors are multilayered ceramic chip capacitors, and the resistor or coil is a chip resistor or chip coil.

15. The protection circuit for a semiconductor laser device according to claim 13, wherein the first and second capacitors and the resistor or coil are mounted on a circuit board on which the semiconductor laser device is mounted, the second capacitor and the resistor or coil are disposed in the vicinity of a terminal of the semiconductor laser device, and the first capacitor is disposed in the vicinity of an input terminal of the circuit board.

16. The protection circuit for a semiconductor laser device according to claim 15, wherein the circuit board has a plurality of wiring lines including a wiring line to supply the semiconductor laser device with an electrical current, and the protection circuit further comprises a metallic pattern for grounding that is formed outside of the plurality of wiring lines and at least along the wiring line to supply the semiconductor laser device with an electrical current.

17. The protection circuit for a semiconductor laser device according to claim 1, wherein the first and second capacitors have an identical capacitance.

18. The protection circuit for a semiconductor laser device according to claim 8, wherein the low frequency capacitor has a capacitance of 1 $\mu$F and the high frequency capacitor has a capacitance of 0.1 $\mu$F.

19. The protection circuit for a semiconductor laser device according to claim 13, wherein the low frequency capacitor has a capacitance of 1 $\mu$F and the high frequency capacitor has a capacitance of 0.1 $\mu$F.

20. The protection circuit for a semiconductor laser device according to claim 8, wherein said low frequency capacitor has a low impedance in a low frequency region, and said high frequency capacitor has a low impedance in a high frequency region.

21. The protection circuit for a semiconductor laser device according to claim 13, wherein said low frequency capacitor has a low impedance in a low frequency region, and said high frequency capacitor has a low impedance in a high frequency region.

* * * * *